United States Patent
Li

(10) Patent No.: US 10,783,035 B1
(45) Date of Patent: Sep. 22, 2020

(54) METHOD AND SYSTEM FOR IMPROVING THROUGHPUT AND RELIABILITY OF STORAGE MEDIA WITH HIGH RAW-ERROR-RATE

(71) Applicant: Alibaba Group Holding Limited, George Town, Grand Cayman (KY)

(72) Inventor: Shu Li, Bothell, WA (US)

(73) Assignee: Alibaba Group Holding Limited, George Town (KY)

( * ) Notice: Subject to any disclaimer, the term of this patent is extended or adjusted under 35 U.S.C. 154(b) by 22 days.

(21) Appl. No.: 16/289,284

(22) Filed: Feb. 28, 2019

(51) Int. Cl.
| | | |
|---|---|---|
| *H03M 13/00* | (2006.01) | |
| *G06F 11/10* | (2006.01) | |
| *H03M 13/29* | (2006.01) | |
| *G11C 29/52* | (2006.01) | |

(52) U.S. Cl.
CPC .......... *G06F 11/1068* (2013.01); *G11C 29/52* (2013.01); *H03M 13/2906* (2013.01)

(58) Field of Classification Search
CPC ............. G06F 11/1068; G06F 11/1076; G06F 11/1048; G06F 11/108; G06F 12/0246; G06F 11/076; G06F 11/1044; H03M 13/2906; G11C 29/52; G11C 16/0483; G11C 29/76; G11C 29/72; G11C 16/349; G11C 29/028; G11C 29/56008; G11C 13/0069; G11C 13/0023; G11C 13/0004; G11C 13/0035; G11C 11/1653
See application file for complete search history.

(56) References Cited

U.S. PATENT DOCUMENTS

| | | |
|---|---|---|
| 6,148,377 A | 11/2000 | Carter |
| 8,751,763 B1 | 6/2014 | Ramarao |
| 8,825,937 B2 | 9/2014 | Atkisson |

(Continued)

FOREIGN PATENT DOCUMENTS

WO    9418634    8/1994

OTHER PUBLICATIONS

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India. pp. 1-7, 2017, <10.1145/3124680.3124741>. <hal-01654985>.

(Continued)

*Primary Examiner* — Guerrier Merant
(74) *Attorney, Agent, or Firm* — Shun Yao; Park, Vaughan, Fleming & Dowler LLP

(57) ABSTRACT

One embodiment provides a system and method for storing data. During operation, the system receives a to-be-written data chunk, sends the to-be-written data chunk to a first and second storage devices. The system performs first and second error-correction-code (ECC) encoding operations on the to-be-written data chunk prior to writing the to-be-written data chunk to the first and second storage media associated with the first and second storage devices, respectively. The first storage medium has a first access granularity and a first raw-error-rate (RER). The second storage medium has a second access granularity and a second RER. The first access granularity is smaller than the second access granularity, the first RER is greater than the second RER, and the second ECC encoding operation has a stronger error-correction capability than the first ECC encoding operation.

20 Claims, 10 Drawing Sheets

(56) References Cited

U.S. PATENT DOCUMENTS

| | | | |
|---|---|---|---|
| 9,015,561 B1* | 4/2015 | Hu | G11C 16/0483 714/773 |
| 9,043,545 B2 | 5/2015 | Kimmel | |
| 9,088,300 B1 | 7/2015 | Chen | |
| 9,280,472 B1 | 3/2016 | Dang | |
| 9,280,487 B2 | 3/2016 | Candelaria | |
| 9,529,601 B1 | 12/2016 | Dharmadhikari | |
| 9,588,698 B1 | 3/2017 | Karamcheti | |
| 9,588,977 B1 | 3/2017 | Wang | |
| 10,013,169 B2 | 7/2018 | Fisher | |
| 10,235,198 B2 | 3/2019 | Qiu | |
| 2002/0073358 A1 | 6/2002 | Atkinson | |
| 2003/0163594 A1 | 8/2003 | Aasheim | |
| 2003/0163633 A1 | 8/2003 | Aasheim | |
| 2005/0195635 A1 | 9/2005 | Conley | |
| 2005/0235067 A1 | 10/2005 | Creta | |
| 2007/0101096 A1 | 5/2007 | Gorobets | |
| 2008/0034154 A1 | 2/2008 | Lee | |
| 2009/0113219 A1 | 4/2009 | Aharonov | |
| 2009/0307249 A1 | 12/2009 | Koifman | |
| 2009/0310412 A1 | 12/2009 | Jang | |
| 2010/0169470 A1 | 7/2010 | Takashige | |
| 2011/0055471 A1 | 3/2011 | Thatcher | |
| 2011/0099418 A1 | 4/2011 | Chen | |
| 2011/0161784 A1 | 6/2011 | Selinger | |
| 2011/0218969 A1 | 9/2011 | Anglin | |
| 2012/0084523 A1 | 4/2012 | Littlefield | |
| 2012/0147021 A1 | 6/2012 | Cheng | |
| 2012/0159289 A1 | 6/2012 | Piccirillo | |
| 2012/0210095 A1 | 8/2012 | Nellans | |
| 2012/0278579 A1 | 11/2012 | Goss | |
| 2012/0284587 A1 | 11/2012 | Yu | |
| 2013/0061029 A1 | 3/2013 | Huff | |
| 2013/0080391 A1 | 3/2013 | Raichstein | |
| 2013/0151759 A1 | 6/2013 | Shim | |
| 2013/0219131 A1 | 8/2013 | Alexandron | |
| 2014/0082273 A1 | 3/2014 | Segev | |
| 2014/0108414 A1 | 4/2014 | Stillerman | |
| 2014/0181532 A1 | 6/2014 | Camp | |
| 2014/0304452 A1 | 10/2014 | De La Iglesia | |
| 2015/0019798 A1 | 1/2015 | Huang | |
| 2015/0106559 A1 | 4/2015 | Cho | |
| 2015/0227316 A1 | 8/2015 | Warfield | |
| 2015/0277937 A1 | 10/2015 | Swanson | |
| 2015/0301964 A1 | 10/2015 | Brinicombe | |
| 2015/0304108 A1 | 10/2015 | Obukhov | |
| 2015/0363271 A1 | 12/2015 | Haustein | |
| 2016/0014039 A1 | 1/2016 | Reddy | |
| 2016/0274636 A1 | 9/2016 | Kim | |
| 2016/0306853 A1 | 10/2016 | Sabaa | |
| 2017/0075583 A1 | 3/2017 | Alexander | |
| 2017/0075594 A1 | 3/2017 | Badam | |
| 2017/0109232 A1 | 4/2017 | Cha | |
| 2017/0147499 A1 | 5/2017 | Mohan | |
| 2017/0162235 A1 | 6/2017 | De | |
| 2017/0212708 A1 | 7/2017 | Suhas | |
| 2017/0228157 A1 | 8/2017 | Yang | |
| 2017/0249162 A1 | 8/2017 | Tsirkin | |
| 2017/0262178 A1 | 9/2017 | Hashimoto | |
| 2017/0285976 A1 | 10/2017 | Durham | |
| 2017/0286311 A1 | 10/2017 | Juenemann | |
| 2017/0344470 A1 | 11/2017 | Yang | |
| 2017/0344491 A1 | 11/2017 | Pandurangan | |
| 2018/0107591 A1 | 4/2018 | Smith | |
| 2018/0143780 A1 | 5/2018 | Cho | |
| 2018/0167268 A1 | 6/2018 | Liguori | |
| 2018/0189182 A1 | 7/2018 | Wang | |
| 2018/0270110 A1 | 9/2018 | Chugtu | |
| 2018/0329776 A1 | 11/2018 | Lai | |
| 2018/0373428 A1 | 12/2018 | Kan | |
| 2019/0012111 A1 | 1/2019 | Li | |
| 2019/0073262 A1 | 3/2019 | Chen | |
| 2019/0205206 A1 | 7/2019 | Hornung | |
| 2019/0377632 A1* | 12/2019 | Oh | G06F 11/1068 |

OTHER PUBLICATIONS

EMC Powerpath Load Balancing and Failover Comparison with native MPIO operating system solutions. Feb. 2011.

Tsuchiya, Yoshihiro et al. "DBLK: Deduplication for Primary Block Storage", MSST 2011, Denver, CO, May 23-27, 2011 pp. 1-5.

Chen Feng, et al. "CAFTL: A Content-Aware Flash Translation Layer Enhancing the Lifespan of Flash Memory based Solid State Devices"< FAST '11, San Jose, CA Feb. 15-17, 2011, pp. 1-14.

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14.

WOW: Wise Ordering for Writes—Combining Spatial and Temporal Locality in Non-Volatile Caches by Gill (Year: 2005).

Helen H. W. Chan et al. "HashKV: Enabling Efficient Updated in KV Storage via Hashing", https://www.usenix.org/conference/atc18/presentation/chan, (Year: 2018).

* cited by examiner

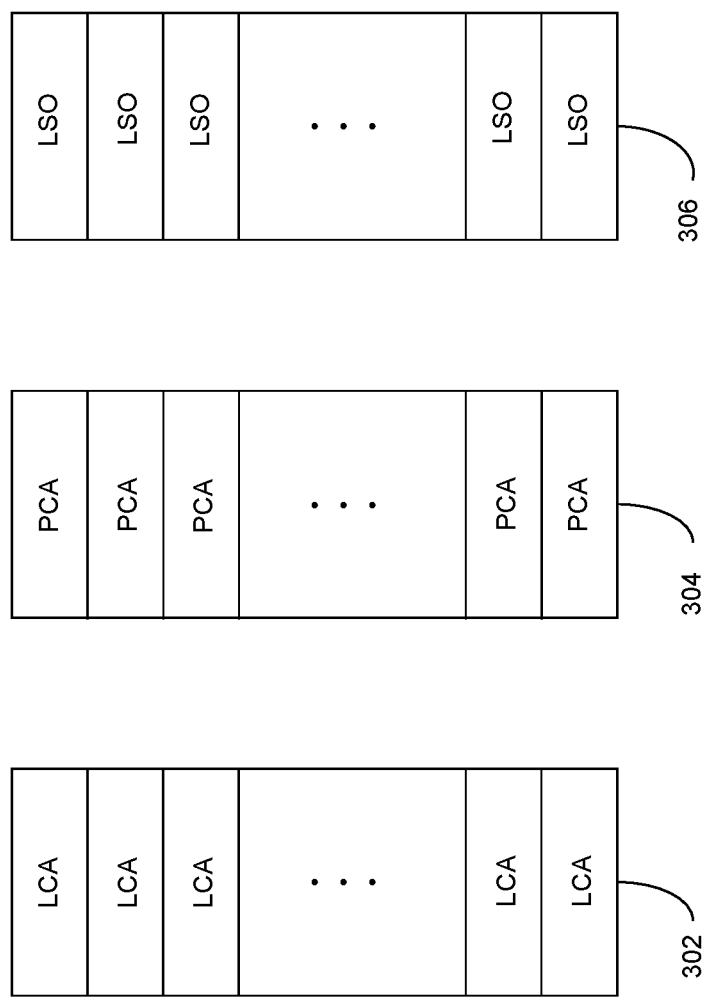

METHOD AND SYSTEM FOR IMPROVING THROUGHPUT AND RELIABILITY OF STORAGE MEDIA WITH HIGH RAW-ERROR-RATE

BACKGROUND

Field

This disclosure is generally related to data storage. More specifically, this disclosure is related to a method and system that can improve the throughput and reliability of storage media that has a relatively high raw-error-rate (RER).

Related Art

In recent years, many different types of novel storage media have been developed, such as 3D Xpoint, phase-change memory (PCM), magnetoresistive random access memory (MRAM), resistive RAM (ReRAM), etc. These novel storage media have provided a number of benefits to modern storage systems. For example, the 3D Xpoint technology developed by Intel and Micron can provide much lower latency and greater endurance than NAND flash. More specifically, the in-place writing enabled by certain novel storage media makes garbage collection (GC) unnecessary.

However, various factors can limit the performance of these novel storage media. More particularly, factors like fabrication maturity, material characteristics, circuit design, etc., can cause these novel storage media to demonstrate a relatively high raw-error-rate (RER), thus significantly limiting application of these novel storage media, especially their application in server systems.

SUMMARY

One embodiment provides a system and method for data storage. During operation, the system receives a to-be-written data chunk, sends the to-be-written data chunk to a first storage device that includes a first storage medium, and performs a first error-correction-code (ECC) encoding operation on the to-be-written data chunk prior to writing the to-be-written data chunk to the first storage medium. The first storage medium has a first access granularity and a first raw-error-rate (RER). The system can further send the to-be-written data chunk to a second storage device that includes a second storage medium, and perform a second ECC encoding operation on the to-be-written data chunk prior to writing the to-be-written data chunk to the second storage medium. The second storage medium has a second access granularity and a second RER. The first access granularity is smaller than the second access granularity, the first RER is greater than the second RER, and the second ECC encoding operation has a stronger error-correction capability than the first ECC encoding operation.

In a variation on this embodiment, the first storage medium can include one or more of: a 3D Xpoint storage medium, a phase-change memory (PCM), a magnetoresistive random access memory (MRAM), and a resistive random access memory (ReRAM).

In a further variation, the first access granularity is at the byte level.

In a variation on this embodiment, the first ECC encoding operation is configured to generate a codeword having a length equal to the first access granularity.

In a variation on this embodiment, the second storage medium comprises a solid state drive (SSD).

In a variation on this embodiment, the system writes the to-be written data chunk to the second storage medium in a log format.

In a variation on this embodiment, the system further updates a logical-address-to-physical address mapping table subsequent to writing the to-be-written data chunk to the first and second storage media. The mapping table can include physical addresses of the data chunk in the first and second storage media.

In a variation on this embodiment, the second ECC encoding operation can include an incremental encoding operation, which includes multiplying the to-be-written data chunk with a sub-matrix of a parity-check matrix to generate a sub-syndrome associated with the to-be-written data chunk, with the width of the sub-matrix being equal to a length of the to-be-written data chunk. The incremental encoding operation can further include accumulating sub-syndromes from previously received to-be-written data chunks belonging to a same ECC codeword to generate a syndrome associated with the data chunk, generating parity data based on the parity-check matrix and the syndrome associated with the to-be-written data chunk in response to the to-be-written data chunk being a last chunk within the same ECC codeword, and writing the parity data to the second storage medium.

In a variation on this embodiment, the system can further receive a read request, retrieve a to-be-read data chunk from the first storage medium based on the read request, perform a first decoding operation corresponding to the first ECC encoding operation on the to-be-read data chunk, and determine whether the decoding operation is successful. In response to the first decoding operation being unsuccessful, the system retrieves a codeword that includes the to-be-read data chunk from the second storage medium. The codeword is generated by the second ECC encoding operation. The system then performs a second decoding operation corresponding to the second ECC encoding operation on the codeword, extracts an error-free data chunk corresponding to the to-be-read data chunk from the decoded codeword, and returns the extracted error-free data chunk.

In a variation on this embodiment, the system can further receive an update request. The system performs an in-place update in the first storage medium based on the update request, writes an update data chunk to the second storage medium, and updates a mapping between a logical address and a physical address of the update data chunk in the second storage medium.

BRIEF DESCRIPTION OF THE FIGURES

FIG. 3 illustrates the mapping among the logical address and physical addresses, according to one embodiment.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention solve the problem of the relatively high raw-error-rate (RER) of emerging storage media. Some embodiments can provide a storage system that incorporates both high-RER storage media (e.g., 3D Xpoint, PCM, MRAM, ReRAM, etc.) and low-RER storage media (e.g., solid-state drives (SSD)). User data can be stored in both the high-RER storage media and the low-RER storage media. Moreover, a novel, hybrid error-encoding scheme can also be provided. The novel error-encoding scheme uses a weak error correction code (ECC) to protect the high-RER media and uses a strong ECC to protect the low-RER media. Moreover, when encoding user data sent to the low-RER media, an incremental encoding mechanism is implemented to ensure that the user data is encoded at the time it is received.

Hybrid Storage System

The emerging storage media, such as storage class memory (SCM), have provided many advantages over SSD, such as higher throughput and lower latency. More specifically, the in-place writing enabled by the SCM makes garbage collection (GC) unnecessary. Raw-error-rate (RER) or raw bit error rate (RBER) is a parameter used for indicating the primal reliability of a storage medium. More particularly, when data is written into a storage medium, due to the strength limitation of the medium to hold the data and noises, certain errors can occur over time. The RER can be calculated as the ratio between the number of erroneous bits and the number of total stored bits. As discussed before, the various emerging storage media often experience higher RERs than conventional storage media, such as HDD or SSD.

Figure 1:
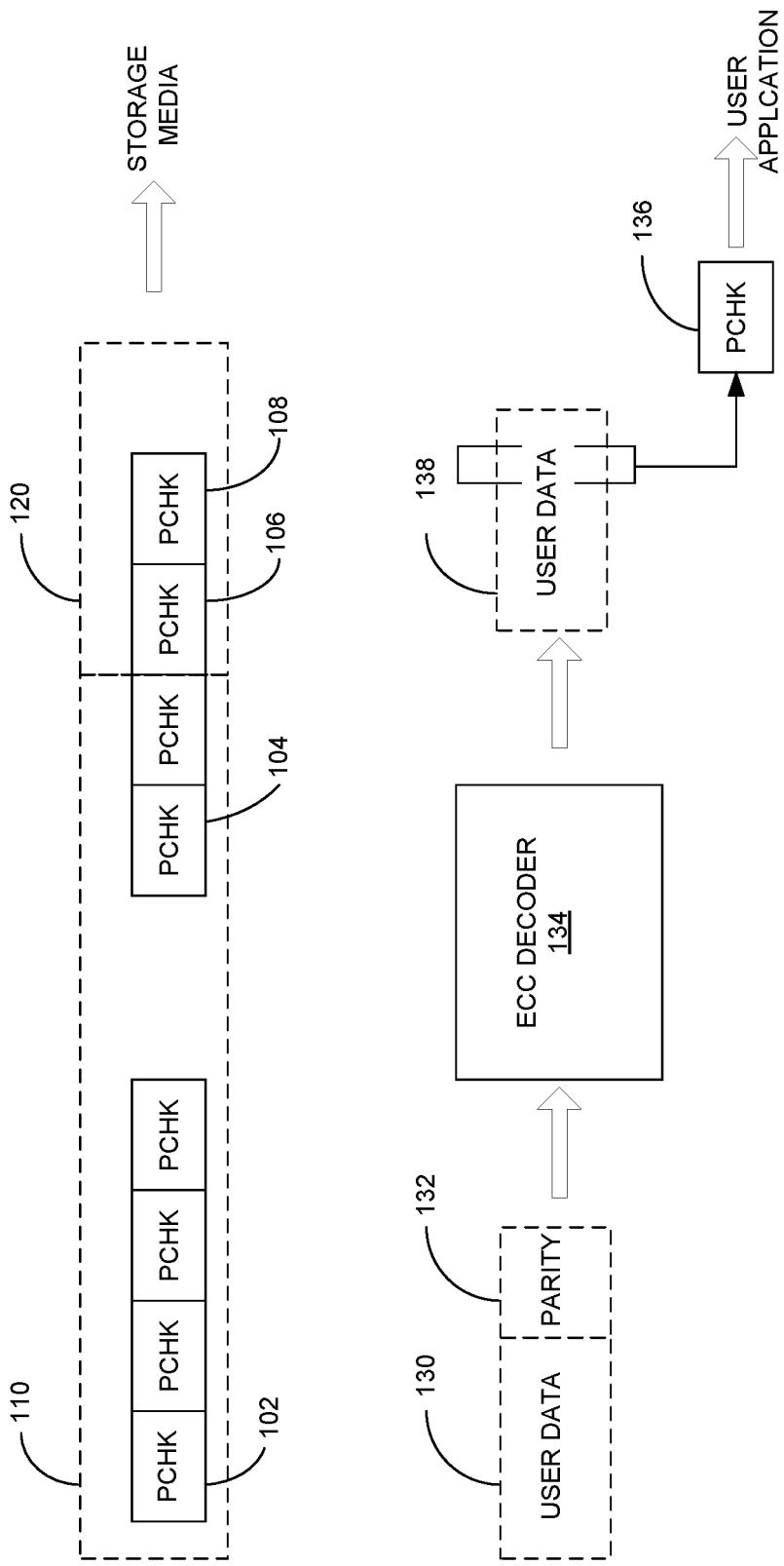
FIG. 1 illustrates an exemplary process of using strong error-correction code to protect a high-RER storage medium (prior art).

One approach to protect the high-RER media from incurring errors is to implement strong error-correction code (ECC), which can ensure data retention and application feasibility. FIG. 1 illustrates an exemplary process of using strong error-correction code to protect a high-RER storage medium (prior art). In FIG. 1, a plurality of user data chunks (e.g., data chunk (or pchk) 102 and pchk 104) from user data 110 can be grouped together to form a larger chunk that can be encoded using the strong ECC. Parity data 120 can include multiple parity data chunks (e.g., pchks 106 and 108) that are generated during the encoding process. During data write, user data 110 and parity data 120 can be written together into the storage media, as shown by the top drawing of FIG. 1.

However, during data read, even if only one or a few data chunks are needed by a user application, the entire larger chunk of noisy user data along with the parity needs to be read out of the high-RER storage media for decoding. The bottom drawing shows that user data 130 and parity data 132 are sent to ECC decoder 134. After decoding, the desired data chunk or chunks (e.g., pchk 136) can be extracted from the clean user data 138 and sent to the requesting application.

As one can see from FIG. 1, this strong-ECC encoding scheme can result in the degraded efficiency of the random read or write due to both read amplification and write amplification. Moreover, it can further negatively affect the endurance and latency of the storage media. Furthermore, this scheme can also cause write difficulty. More specifically, each user data update, even only one pchk that needs update, will require the entire codeword to be read out, followed by decoding, data updating, error encoding, and writing back the updated user data and the updated parity data. Such a process can significantly increase the write latency, even when garbage collection is not necessary.

To solve this problem, some embodiments of the present invention provide a hybrid storage system implementing both a high-RER storage medium protected by strong ECC and a low-RER storage media protected by a weak ECC, and the user data can be stored in both media. Because the low-RER storage is only accessed when the weak ECC protecting the high-RER storage medium fails, the overall latency of the storage system can be significantly reduced.

Figure 2A:
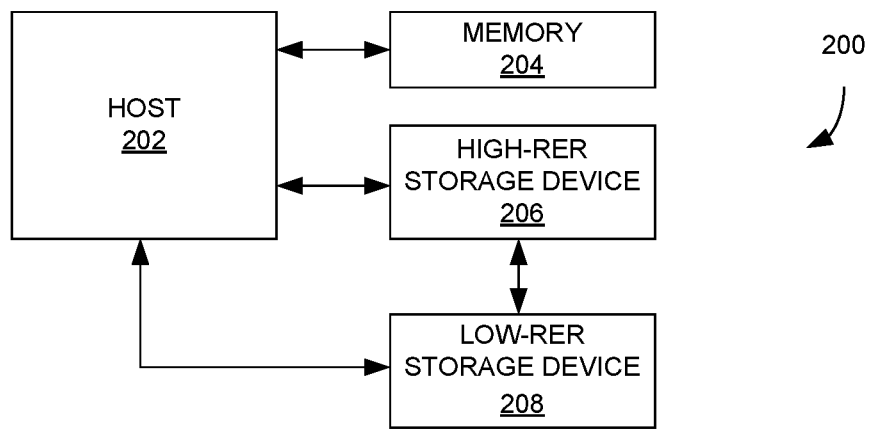
FIG. 2A illustrates a hybrid storage system, according to one embodiment.

FIG. 2A illustrates a hybrid storage system, according to one embodiment. Storage system 200 can include a host 202, a memory 204, a high-RER storage device 206, and a low-RER storage device 208. Memory 204 can include one or more random access memory (RAM) modules, such as dual in-line memory modules (DIMMs). High-RER storage device 206 can include devices based on emerging storage media, such as 3D Xpoint, PCM, MRAM, ReRAM, etc. In some embodiments, the RER of high-RER storage device 206 can be equal to or greater than $1 \times 10^{-5}$. Low RER storage device 208 can be based on conventional storage media, such as SSD. In some embodiments, the RER of low-RER storage device 208 can be equal to or less than $1 \times 10^{-6}$.

Figure 2B:
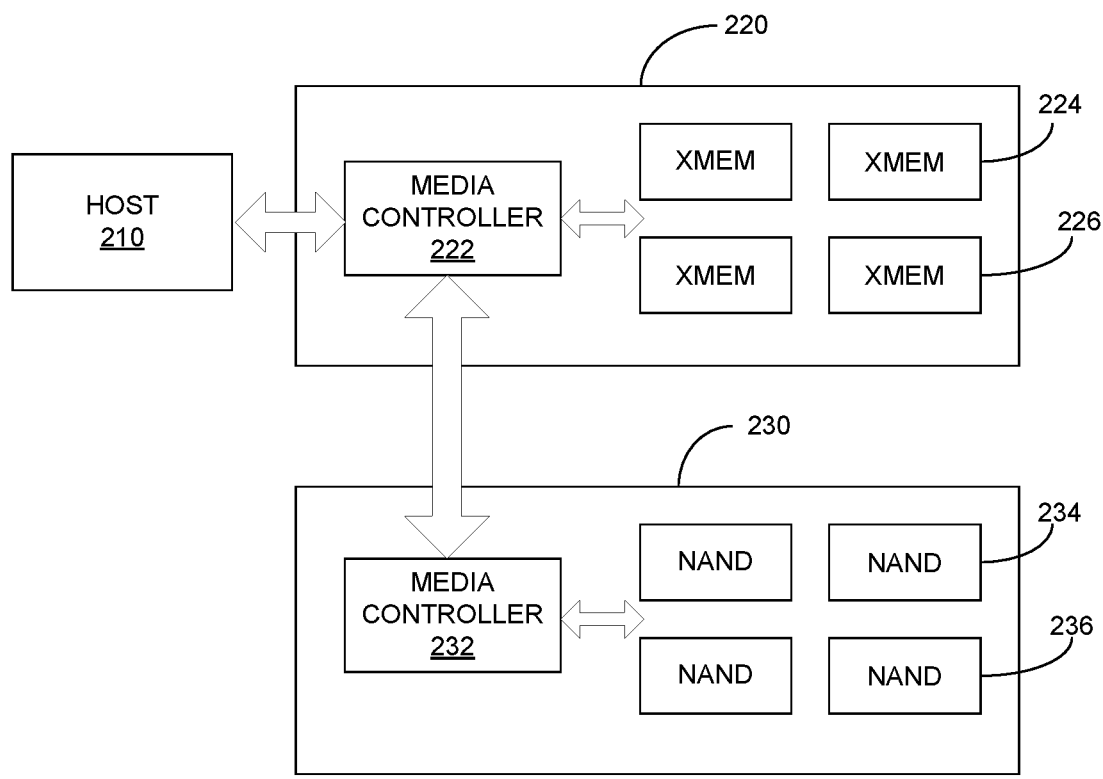
FIG. 2B illustrates the data flow in the hybrid storage system, according to one embodiment.

FIG. 2B illustrates the data flow in the hybrid storage system, according to one embodiment. During operation, user data are sent from host 210 to media controller 222 of high-RER storage device 220 and to media controller 232 of low-RER storage device 230. Note that, when one data chunk with memory granularity (e.g., 8 bytes) is sent to high-RER storage device 220, a copy of the same data chunk will also be sent to low-RER storage device 230.

Media controller 222 of high-RER storage device 220 can be responsible for writing the user data to physical media within high-RER storage device 220. In some embodiments, high-RER storage device 220 can include multiple high-RER memory modules, denoted XMEMs (e.g., XMEMs 224 and 226). In some embodiments, media controller 222 can implement a weak ECC, where a short codeword (e.g., the length of the codeword can match the memory-access granularity) is required for the ECC. Alternatively, the length of the ECC codeword can be a few times (e.g., less than five times) the memory-access granularity. For certain high-RER storage media, such as 3D Xpoint, the memory-access granularity can be at the byte level.

Media controller 232 of low-RER storage device 230 can be responsible for writing a copy of the user data to physical media within low-RER storage device 230. In some embodiments, low-RER storage device 230 can include multiple low-RER memory modules, (e.g., NAND flash drives 234 and 236). In some embodiments, media controller 232 can implement a strong ECC, which requires long codewords. In some embodiments, the required codeword length of the strong ECC can be ten times or more the memory-access granularity. For example, the codeword length of the strong ECC can be 1024 bits or longer. Moreover, when writing data to the physical media of low-RER storage device 230, media controller 232 can write the data in a log format. In other words, new data can be appended to previously written data in the physical media. Note that, because the low-RER memory modules (e.g., the NAND flash drives) can only be updated on the page level, garbage collection will be needed. In some embodiments, when low-RER storage device 230 is almost full (e.g., exceeding a predetermined threshold), garbage collection can be performed in the background to free up NAND blocks.

When the user data is written into the high-RER storage device and the low-RER storage device, the mapping between the logical address of the user data and the physical address (e.g., the address in the high-RER media and the address in the low-RER media) is updated. Because the user data is stored in both media, the mapping table can include the physical addresses of a data chunk in both media. In some embodiments, the logical address of a data chunk (i.e., the logical chunk address or LCA) can be mapped to a physical address (i.e., the physical chunk address or PCA) in the high-RER storage media as well as an offset value (e.g., the log SSD offset or LSO) in the low-RER storage media. Note that, because the low-RER media stores user data in a log format, one can use the offset value, which indicates the start location of the data chunk, to specify the physical location of the data chunk. FIG. 3 illustrates the mapping among the logical address and physical addresses, according to one embodiment.

In FIG. 3, entries in column 302 can include the LCAs of the user data chunks, entries in column 304 can include the PCAs of the user data chunks, and entries in column 306 can include the LSOs of the data chunks. In some embodiments, the storage system can maintain a single mapping table that includes the mapping among the LCAs, the PCAs, and the LSOs of the user data chunks. In a further embodiment, the LCAs can be recorded in the table in a consecutive and ascending way, thus making it possible to maintain a mapping table that includes only two columns, PCA column 304 and LSO column 306, thus reducing data overhead.

Figure 4:
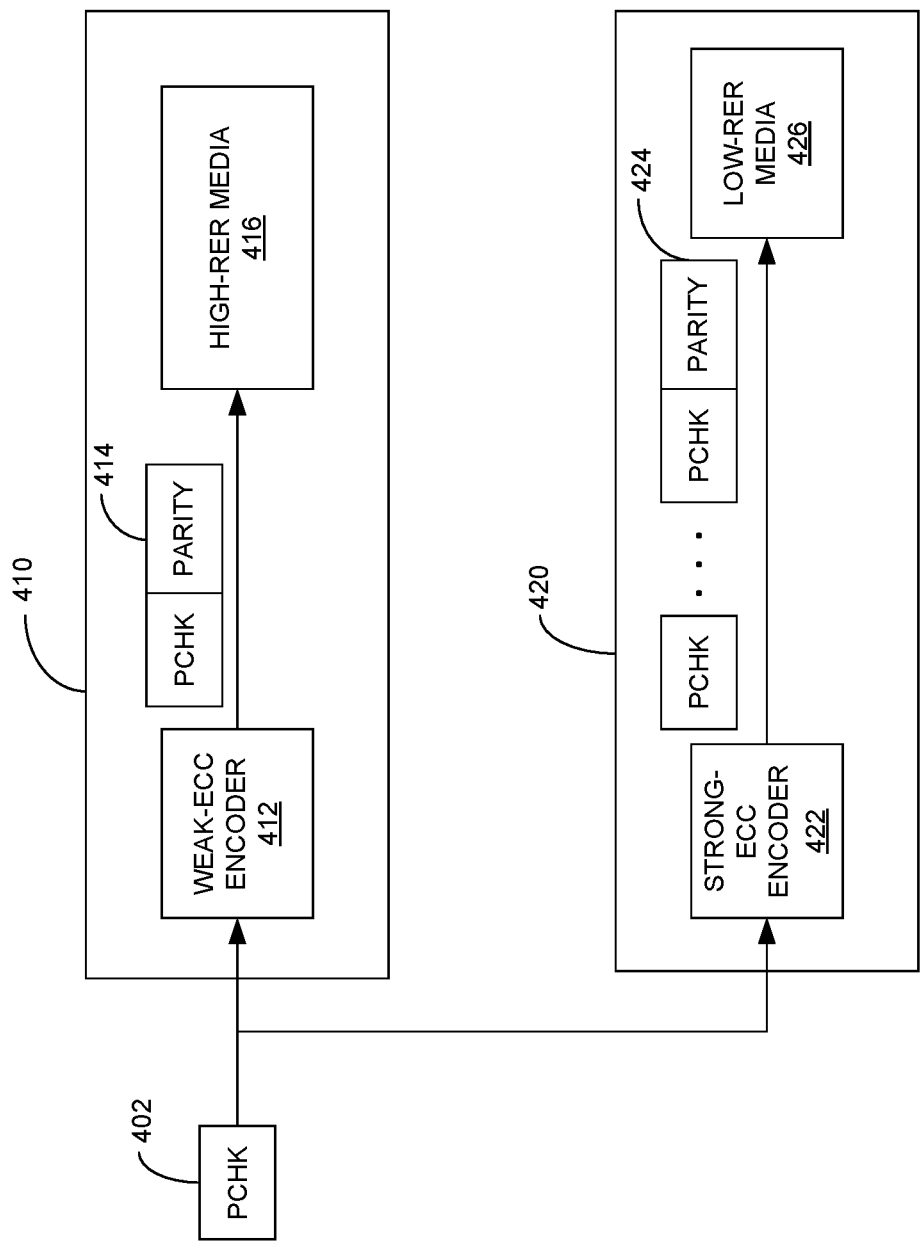
FIG. 4 illustrates the exemplary hybrid error-correction coding (ECC) scheme, according to one embodiment.

FIG. 4 illustrates the exemplary hybrid error-correction coding (ECC) scheme, according to one embodiment. In FIG. 4, when a new data chunk having memory-access granularity (e.g., pchk 402) is sent to high-RER storage device 410, a copy of the data chunk is also sent to low-RER storage device 420.

High-RER storage device 410 can include a weak-ECC encoder 412, which can encode the new data chunk. For example, weak-ECC encoder 412 can be a block encoder that uses the received data chunk (e.g., pchk 402) as input to generate parity block 414. The user data chunk (e.g., pchk 402) and parity block 414 together form a short codeword that will be stored in high-RER storage media 416. In some embodiments, the length of the ECC codeword can equal the access granularity (e.g., 8 bytes) of high-RER storage media 416. Alternatively, the length of the ECC codeword can be a few times (e.g., less than five times) the memory-access granularity. For example, if the memory-access granularity is 8 bytes, the length of the ECC codeword used by weak-ECC encoder 412 can also be 8 bytes or it can be 16 bytes.

Because the length of the ECC codeword positively correlate with the power of the ECC, the weak-ECC using short codewords can have a limited capacity in protecting the high-RER storage media within high-RER storage device 410. For example, the uncorrectable bit error rate (UBER) may exceed what is acceptable for storage in a server system (e.g., around $1\times10^{-16}$).

Low-RER storage device 420 can include a strong-ECC encoder 422. In some embodiments, strong-ECC encoder 422 can be a block encoder that uses multiple accumulated data chunks as input to generate parity block 424. The user data chunks and parity block 424 together form a long codeword that will be stored in low-RER storage media 426. Note that, although the strong ECC can lead to read amplification and write amplification, reading from or writing into the strong ECC-protected low-RER storage media 426 only occurs when the weak ECC fails or when an uncorrectable error is found in high-RER storage media 416; thus, the impact of the strong ECC on the latency and efficiency of the storage system can be reduced. For example, the weak ECC can lead to an UBER of around $1\times10^{-16}$, meaning that the chance of accessing the low-RER storage media can be around $1\times10^{-16}$, which is very low. As a result, the latency caused by the strong ECC during read and write does not significantly affect the overall latency of the storage system.

Conventional ECC-encoding schemes often encode user data simultaneously. However, for a strong-ECC scheme that requires a long codeword, simultaneous encoding may require the user data to be accumulated at the media controller before it can be encoded and saved. This can increase the write latency. To overcome this problem, in some embodiments, the strong-ECC encoder residing on the low-RER storage device may implement a novel incremental encoding scheme that encodes user data in real time in a "first come, first served" fashion.

More specifically, the data portion of the parity-check matrix used by the strong-ECC encoder can be divided into a number of sub-matrices, with the width of the sub-matrices matching the length of the user data chunk, which can be the memory-access granularity of the high-RER media. For example, if the access granularity of the high-RER media is 8 bytes, the width of each sub-matrix can also be 8 bytes. When a user data chunk (or pchk) having the size of the memory-access granularity arrives at the low-RER storage device, the user data chunk can be multiplied with a sub-matrix of the parity-check matrix to generate a sub-syndrome. Subsequently arrived user data chunks can be multiplied with corresponding sub-matrices to generate additional sub-syndromes. A sub-syndrome created at a stage i, which is the stage when the $i_{th}$ user data block within the long codeword is received, can be accumulated consecutively with all sub-syndromes created in all previous stages to create syndrome $S_i$. The syndrome $S_i$ can be kept as the intermediate result of the incremental encoding scheme. Subsequent to the last user data block within the long codeword being received, the syndrome of the final stage ($S_k$) can be multiplied with the parity portion of the parity-check matrix in order to generate the parity data.

During data write, each user data chunk or pchk is written as soon as it is received by the low-RER storage device, and the syndrome for each stage is kept temporarily. After the final stage, the parity is generated and written into the low-RER media. This can result in the consecutive ordering of all the user data chunks (or pchks) and the parity data.

Moreover, the real-time incremental encoding scheme can ensure data consistency by writing the received user data at a gradual pace.

Figure 5A:
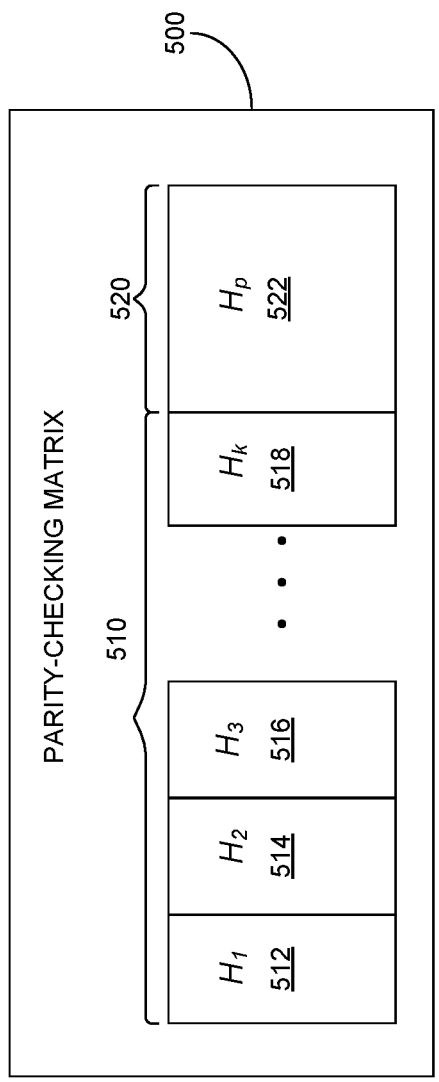
FIGS. 5A and 5B illustrate the incremental encoding scheme, according to one embodiment.
Figure 5B:
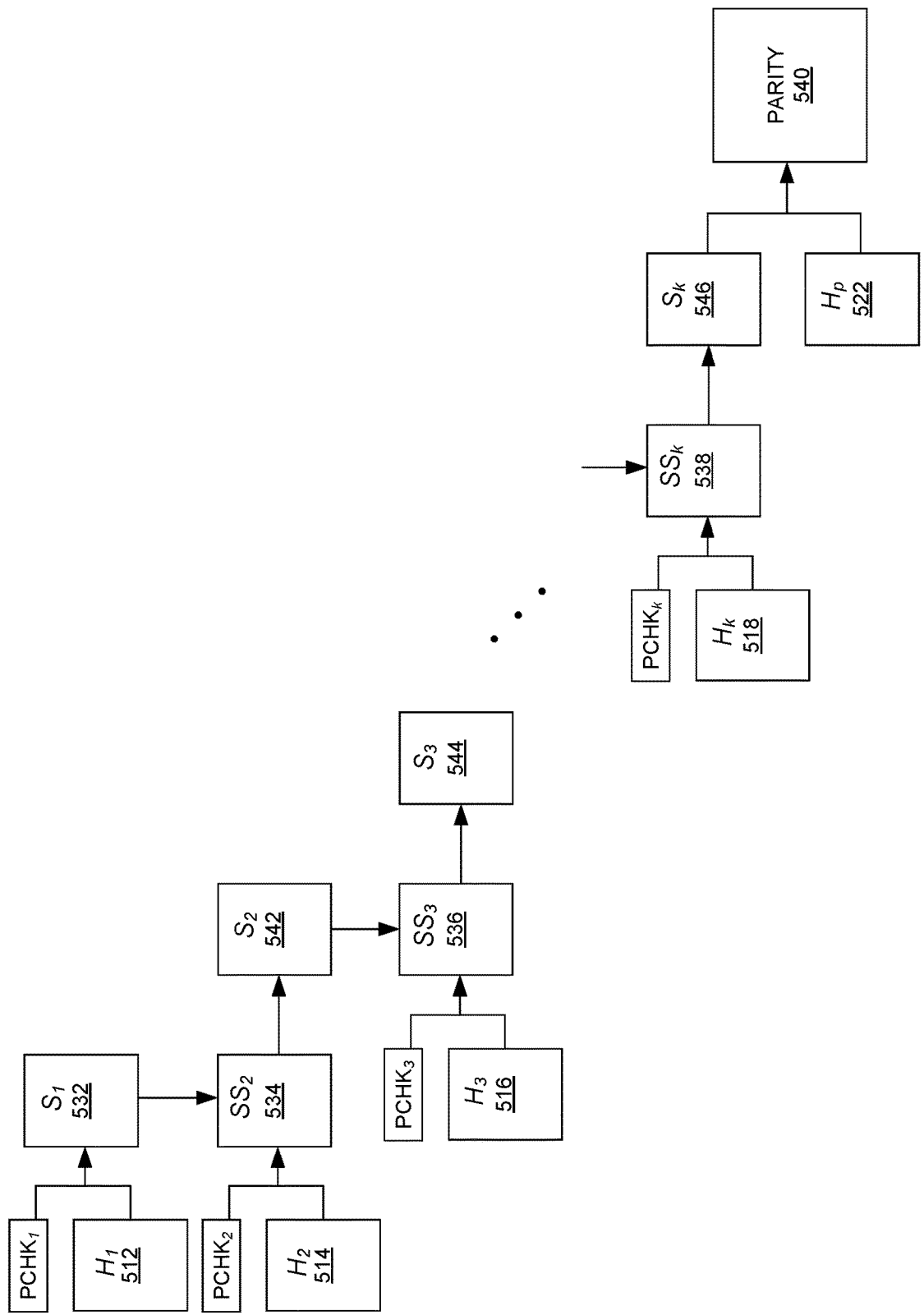

FIGS. 5A and 5B illustrate the incremental encoding scheme, according to one embodiment. In FIG. 5A, a parity-check matrix 500 can include a data portion 510 and a parity portion 520. Note that the parity-check matrix H can be derived from a generator matrix G, and for an [n, k]-code, where n denotes the length of the codeword and k denotes the length of the user data, the generator matrix can be in a standard form $G=[I_k|P]$, and the parity-check matrix is given by: $H=[-P^T I|I_{n-k}]$. Data portion 510 can be $[-P^T]$, and parity portion 520 can be $[I_{n-k}]$, where I is the unit matrix. Data portion 510 of parity-check matrix 500 can be divided into a plurality of sub-matrices, such as $H_1$ 512, $H_2$ 514, $H_3$ 516, and $H_k$ 518. Parity portion 520 can include a sub-matrix $H_p$ 522.

FIG. 5B shows that when a first user data chunk $pchk_1$ is received, it can be multiplied with sub-matrix 512, which is the first sub-matrix of data portion 510 of parity-check matrix 500, to generate an initial syndrome $S_1$ 532. More specifically, $S_1=H_1 \times pchk_1$. User data chunk $pchk_1$ can then be sent to the low-RER storage, whereas initial syndrome $S_1$ can be stored temporarily at the media controller.

When a second user data chunk $pchk_2$ is received, it can be multiplied with sub-matrix 514, which is the second sub-matrix of data portion 510 of parity-check matrix 500, to generate a sub-syndrome $SS_2$ 534, which can then be combined with initial syndrome $S_1$ 532 to generate a syndrome $S_2$ 542. In other words, $SS_2=H_2 \times pchk_2$ and $S_2=S_1+SS_2$. Similarly, user data chunk $pchk_2$ can be sent to the low-RER storage media for storage, whereas syndrome $S_2$ can be stored temporarily at the media controller. In some embodiments, the previous syndrome can be deleted.

This process repeats itself each time a new user data chunk is received. For example, when user data chunk $pchk_2$ is received, sub-syndrome $SS_3$ 536 and syndrome $S_3$ 544 can be generated, with $SS_3=H_3 \times pchk_3$ and $S_3=S_2+SS_3$. When the last user data chunk $pchk_k$ within the codeword is received, sub-syndrome $SS_k$ 538 and final syndrome $S_k$ 546 can be generated, with $SS_k=H_k \times pchk_k$ and $S_k=S_{k-1}+SS_k$. Final syndrome $S_k$ 546 can then be multiplied with the inverse of sub-matrix 522, which is the parity portion of parity-check matrix 500, to obtain parity 540. Subsequent to the generation of parity 540, the last user data chunk $pchk_k$ and parity 540 can then be written consecutively into the low-RER storage media. This way, the user data chunks ($pchk_1$ through $pchk_k$) and parity 540 are written into the low-RER storage media in a consecutive order. As discussed previously, the physical address of the user data chunks in the low-RER storage media can be recorded as offset values, which indicate the start locations of the data chunks.

System Operation

Figure 6:
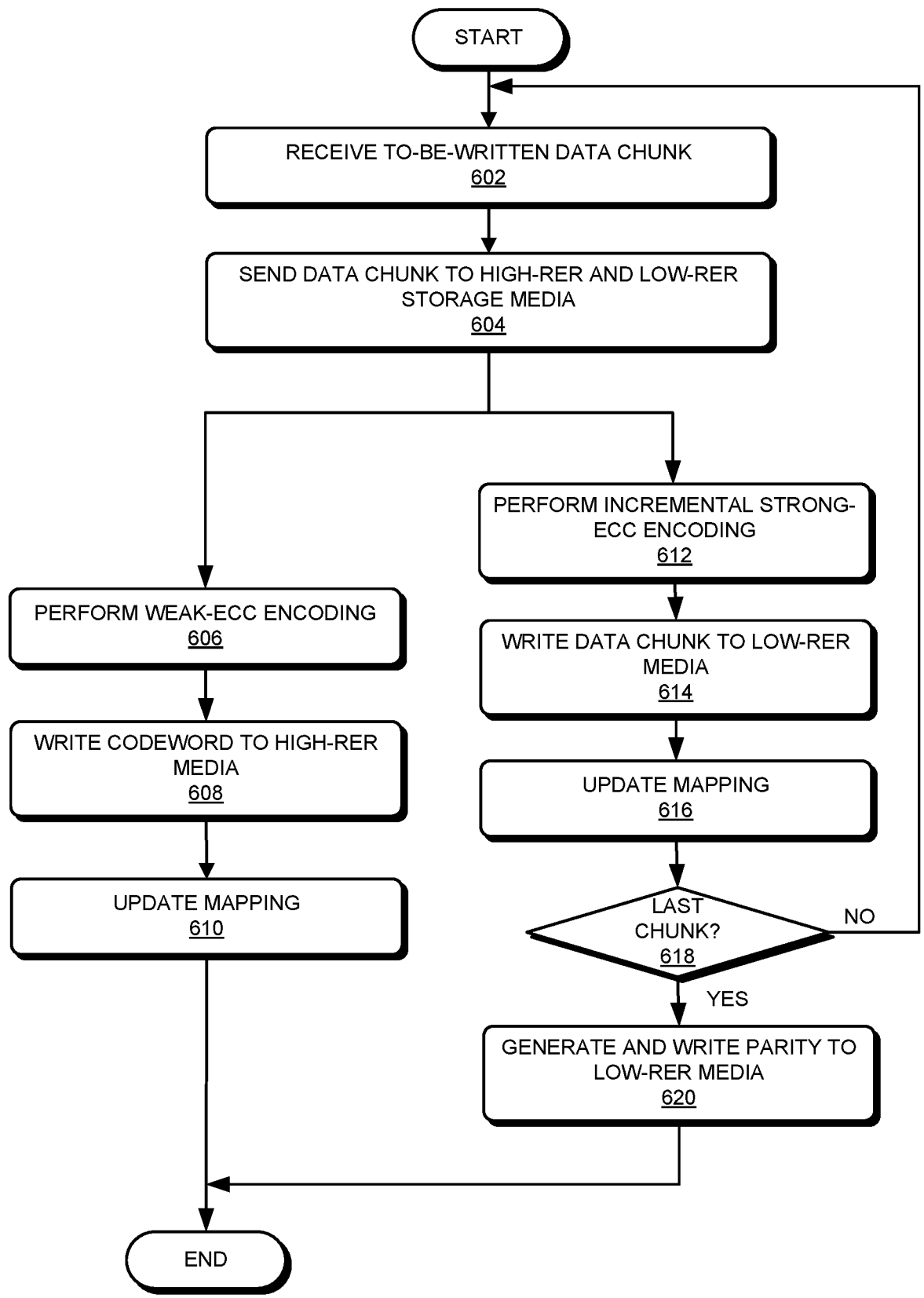
FIG. 6 presents a flowchart illustrating an exemplary data-write process, according to one embodiment.

FIG. 6 presents a flowchart illustrating an exemplary data-write process, according to one embodiment. During data write, the hybrid storage system receives, from a host application, a to-be-written user data chunk (operation 602). The to-be-written data chunk can be sent to the controller of the high-RER storage media as well as the low-RER storage media (operation 604). In some embodiments, the to-be-written data chunk can be sent simultaneously to the controllers.

Upon receiving the to-be-written data chunk, an ECC encoder residing on the controller of the high-RER storage media can perform a weak-ECC encoding operation (operation 606), and the resulting ECC codeword, which can include the user data and the parity bits, can be written into the high-RER storage media (operation 608). In some embodiments, the length of the ECC codeword can be the same as the memory-access granularity of the high-RER storage media to allow for direct write to the high-RER storage media. In some embodiments, the length of the to-be-written data chunk can be 8 bytes. The system then updates the mapping between the logical address and the physical address in the high-RER storage media (operation 610).

In the meantime, an ECC encoder residing on the controller of the low-RER storage media can perform an incremental strong-ECC encoding operation (operation 612). In some embodiments, performing the incremental encoding operation can involve generating a sub-syndrome as well as a syndrome associated with the received data chunk. The system writes the user data chunk into the low-RER media (operation 614) and updates a mapping between the logical address and starting position (expressed as an offset value) of the data chunk in the low-RER media (operation 616). In some embodiments, the user data chunk is written into the low-RER media in a log format. More specifically, the newly received data chunk is appended after a last written data chunk.

The ECC encoder then determines whether the received data chunk is the last chunk within a relatively long codeword (operation 618). The length of the relatively long codeword can be at least 10 times the memory-access granularity. If the received data chunk is not the last chunk, the system waits to receive new user data chunks (operation 602). If so, the ECC encoder generates the parity and writes the parity, into the low-RER storage media (operation 620).

Figure 7:
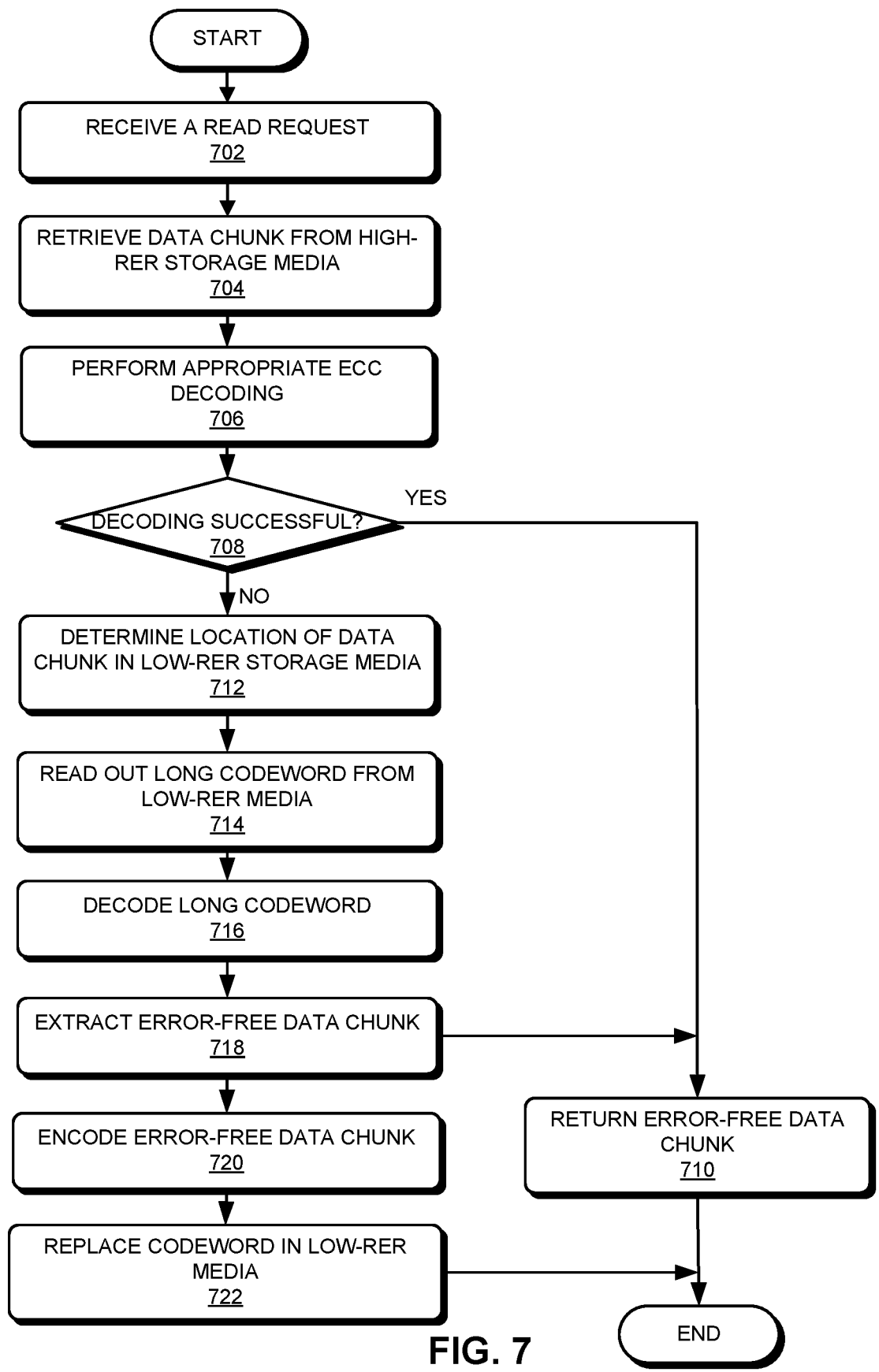
FIG. 7 presents a flowchart illustrating an exemplary data-read process, according to one embodiment.

FIG. 7 presents a flowchart illustrating an exemplary data-read process, according to one embodiment. During data read, the hybrid storage system receives, from a host application, a read request (operation 702). Based on the read request, the system retrieves a data chunk from the high-RER storage media (operation 704). The size of the data chunk is determined by the memory-access granularity. In some embodiments, the high-RER storage media can have an access granularity at the byte level, such as a single byte or a few (e.g., 8) bytes.

The system then decodes the noisy data using the appropriate ECC decoding scheme (operation 706) and determines whether the decoding is successful (operation 708). In some embodiments, the high-RER storage media can be protected by a weak or shorter ECC code, with the length of the ECC codeword equal to the memory-access granularity. If the decoding is successful, the error-free data can be sent to the application requesting the data (operation 710).

If the ECC decoding fails, the system determines the location of the data chunk in the low-RER storage media (operation 712). In some embodiments, the system can also determine the long codeword that the data chunk belongs to by checking the metadata maintained at the controller of the low-RER storage media. The system can then read out the long codeword that includes the requested data chunk (operation 714) and decodes the entire codeword using the appropriate strong-ECC decoding scheme (operation 716). Note that the ECC scheme is a strong-ECC scheme and the likelihood of unsuccessful decoding is extremely small.

The system can then extract the error-free data chunk from the decoded codeword (operation 718) and returns the error-free data chunk to the requesting user application (operation 710). In addition to returning the requested data, once the error-free data chunk is recovered, the system can also use the recovered error-free data chunk to correct the error in the high-RER media. To do so, the system sends the error-free data chunk to the ECC encoder that protects the high-RER storage media for ECC encoding (operation 720). In some embodiments, the ECC codeword for the high-RER storage media can have a length equal to the memory-access granularity. The ECC codeword can then be sent to the high-RER storage media. More specifically, in-place writing can be performed to replace the previous codeword containing uncorrectable errors with the new codeword (operation 722).

In addition to reducing the read latency, because the likelihood of needing to read out the long codeword is small, embodiments of the present invention can significantly reduce the latency during data update. Note that the conventional high-RER-media-based storage system updates data by reading out the long codeword, followed by decoding, replacing, encoding, and writing operations. Such a conventional update procedure can lead to both read and write amplifications. On the other hand, data update in the hybrid system can be much simpler. In particular, it is no longer necessary to read out a long codeword from the storage media.

Figure 8:
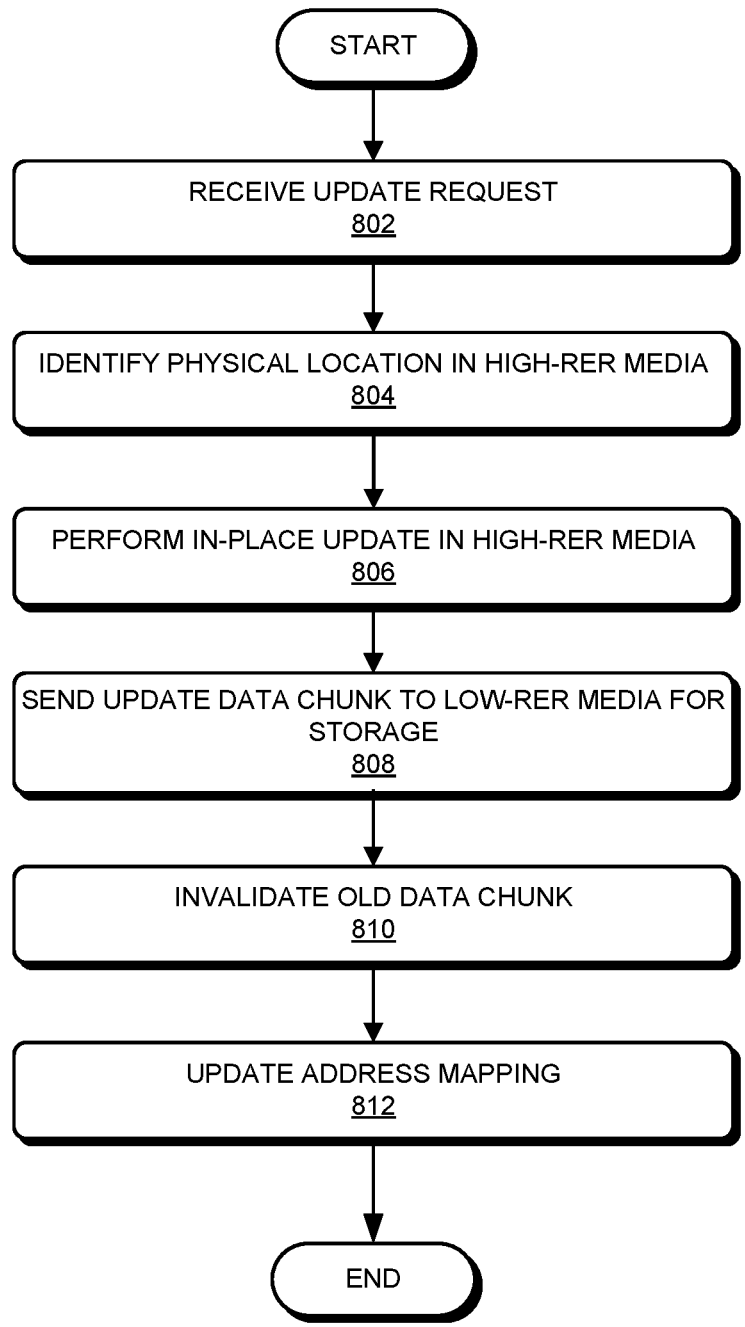
FIG. 8 presents a flowchart illustrating an exemplary data-update process, according to one embodiment FIG. 9 conceptually illustrates an electronic system, which implements some embodiments of the subject technology.

FIG. 8 presents a flowchart illustrating an exemplary data-update process, according to one embodiment. During operation, the system receives an update request (operation 802) and identifies the physical location within the high-RER media of the data chunk that needs the update (operation 804). Subsequently, the system performs the in-place update in the high-RER media (operation 806). More specifically, the system can replace the old data chunk with the new data chunk included in the update request.

In addition to updating the high-RER media, the system can also send the update data chunk to the low-RER media for storage (operation 808). The update data chunk can then be written into the low-RER media the same way a new data chunk is written. More particularly, the update data chunk can be appended after a most recently written data chunk in the low-RER media. Moreover, incremental ECC encoding can be performed on the update data chunk, and the sub-syndrome and syndrome associated with the update data chunk can be generated and temporally stored. This allows the update data chunk to be protected by the strong ECC. In the event of uncorrectable errors occurring within the update data chunk in the high-RER media, the update data chunk stored in the low-RER media can be a backup copy. Subsequent to writing the data chunk in the low-RER media, the system can also invalidate the old data chunk stored in the low-RER media (operation 810) and updates the address mapping (operation 812).

As one can observe from FIG. 8, the ability to allow in-place updating and, at the same time, provide strong ECC protection to the update data chunk enables the hybrid storage system to have better performance and lower latency compared to conventional storage systems that are either based on the high-RER media or the low-RER media alone.

Figure 9:
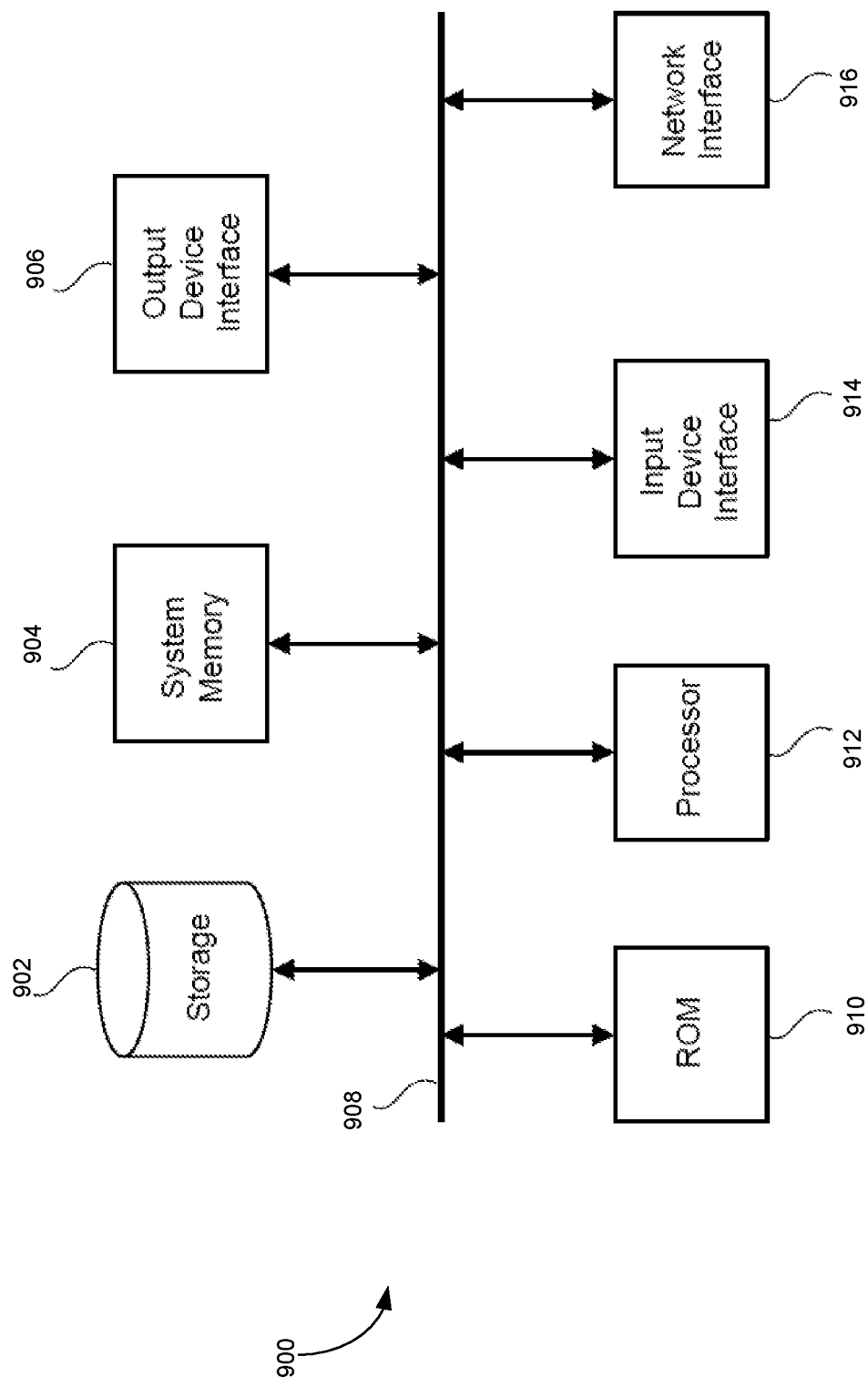

FIG. 9 conceptually illustrates an electronic system, which implements some embodiments of the subject technology. Electronic system 900 can be a client, a server, a computer, a smartphone, a PDA, a laptop, or a tablet computer with one or more processors embedded therein or coupled thereto, or any other sort of electronic device. Such an electronic system includes various types of computer-readable media and interfaces for various other types of computer-readable media. Electronic system 900 includes a bus 908, processing unit(s) 912, a system memory 904, a read-only memory (ROM) 910, a permanent storage device 902, an input device interface 914, an output device interface 906, and a network interface 916.

Bus 908 collectively represents all system, peripheral, and chipset buses that communicatively connect the numerous internal devices of electronic system 900. For instance, bus 908 communicatively connects processing unit(s) 912 with ROM 910, system memory 904, and permanent storage device 902.

From these various memory units, processing unit(s) 912 retrieves instructions to execute and data to process in order to execute the processes of the subject disclosure. The processing unit(s) can be a single processor or a multi-core processor in different implementations.

ROM 910 stores static data and instructions that are needed by processing unit(s) 912 and other modules of the electronic system. Permanent storage device 902, on the other hand, is a read-and-write memory device. This device is a non-volatile memory unit that stores instructions and data even when electronic system 900 is off. Some implementations of the subject disclosure use a mass-storage device (such as a magnetic or optical disk and its corresponding disk drive) as permanent storage device 902.

Other implementations use a removable storage device (such as a floppy disk, flash drive, and various types of disk drive) as permanent storage device 902. Like permanent storage device 902, system memory 904 is a read-and-write memory device. However, unlike storage device 902, system memory 904 is a volatile read-and-write memory, such as a random access memory. System memory 904 stores some of the instructions and data that the processor needs at runtime. In some implementations, the processes of the subject disclosure are stored in system memory 904, permanent storage device 902, and/or ROM 910. From these various memory units, processing unit(s) 912 retrieves instructions to execute and data to process in order to execute the processes of some implementations.

Bus 908 also connects to input and output device interfaces 914 and 906. Input device interface 914 enables the user to communicate information and send commands to the electronic system. Input devices used with input device interface 914 include, for example, alphanumeric keyboards and pointing devices (also called "cursor control devices"). Output device interface 906 enables, for example, the display of images generated by the electronic system 900. Output devices used with output device interface 906 include, for example, printers and display devices, such as cathode ray tubes (CRT) or liquid crystal displays (LCD). Some implementations include devices such as a touchscreen that function as both input and output devices.

Finally, as shown in FIG. 9, bus 908 also couples electronic system 900 to a network (not shown) through a network interface 916. In this manner, the computer can be a part of a network of computers (such as a local area network ("LAN"), a wide area network ("WAN"), an intranet, or a network of networks, such as the Internet. Any or all components of electronic system 900 can be used in conjunction with the subject disclosure.

These functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A computer-implemented method for storing data, the method comprising:
   receiving a to-be-written data chunk;
   sending the to-be-written data chunk to a first storage device comprising a first storage medium, wherein the first storage medium has a first access granularity and a first raw-error-rate (RER);
   performing a first error-correction-code (ECC) encoding operation on the to-be-written data chunk prior to writing the to-be-written data chunk to the first storage medium;
   sending the to-be-written data chunk to a second storage device comprising a second storage medium, wherein the second storage medium has a second access granularity and a second RER; and
   performing a second ECC encoding operation on the to-be-written data chunk prior to writing the to-be-written data chunk to the second storage medium;
   wherein the first access granularity is smaller than the second access granularity;
   wherein the first RER is greater than the second RER; and
   wherein the second ECC encoding operation has a stronger error-correction capability than the first ECC encoding operation.

2. The computer-implemented method of claim 1, wherein the first storage medium comprises one or more of:
   a 3D Xpoint storage medium;
   a phase-change memory (PCM);
   a magnetoresistive random access memory (MRAM); and
   a resistive random access memory (ReRAM).

3. The computer-implemented method of claim 2, wherein the first access granularity is at the byte level.

4. The computer-implemented method of claim 1, wherein the first ECC encoding operation is configured to generate a codeword having a length equal to the first access granularity.

5. The computer-implemented method of claim 1, wherein the second storage medium comprises a solid state drive (SSD).

6. The computer-implemented method of claim 1, further comprising:
   writing the to-be written data chunk to the second storage medium in a log format.

7. The computer-implemented method of claim 1, further comprising updating a logical-address-to-physical address mapping table subsequent to writing the to-be-written data chunk to the first and second storage media;
   wherein the mapping table comprises physical addresses of the data chunk in the first and second storage media.

8. The computer-implemented method of claim 1, wherein the second ECC encoding operation comprises an incremental encoding operation, which comprises:
   multiplying the to-be-written data chunk with a sub-matrix of a parity-check matrix to generate a sub-syndrome associated with the to-be-written data chunk, wherein a width of the sub-matrix equals to a length of the to-be-written data chunk;
   accumulating sub-syndromes from previously received to-be-written data chunks belonging to a same ECC codeword to generate a syndrome associated with the data chunk;
   in response to the to-be-written data chunk being a last chunk within the same ECC codeword, generating parity data based on the parity-check matrix and the syndrome associated with the to-be-written data chunk; and
   writing the parity data to the second storage medium.

9. The computer-implemented method of claim 1, further comprising:
   receiving a read request;
   retrieving a to-be-read data chunk from the first storage medium based on the read request;
   performing a first decoding operation corresponding to the first ECC encoding operation on the to-be-read data chunk;
   determining whether the decoding operation is successful;
   in response to the first decoding operation being unsuccessful, retrieving a codeword that includes the to-be-read data chunk from the second storage medium, wherein the codeword is generated by the second ECC encoding operation;
   performing a second decoding operation corresponding to the second ECC encoding operation on the codeword;
   extracting an error-free data chunk corresponding to the to-be-read data chunk from the decoded codeword; and
   returning the extracted error-free data chunk.

10. The computer-implemented method of claim 1, further comprising:
    receiving an update request;
    performing an in-place update in the first storage medium based on the update request;
    writing an update data chunk to the second storage medium; and
    updating a mapping between a logical address and a physical address of the update data chunk in the second storage medium.

11. A data storage system, comprising:
    a first storage device configured to store a data chunk in response to receiving a write request, wherein the first storage device comprises a first storage medium and a first error-correction code (ECC) encoder, wherein the first storage medium has a first access granularity and a first raw-error-rate (RER);
    a second storage device configured to stored a copy of the data chunk in response to the write request, wherein the second storage device comprises a second storage medium and a second ECC encoder, wherein the second storage medium has a second access granularity and a second raw error rate (RER);
    wherein the first access granularity is smaller than the second access granularity;
    wherein the first RER is greater than the second RER; and
    wherein the second ECC encoder has a stronger error-correction capability than the first ECC encoder.

12. The data storage system of claim 11, wherein the first storage medium comprises one or more of:
    a 3D Xpoint storage medium;
    a phase-change memory (PCM);
    a magnetoresistive random access memory (MRAM); and
    a resistive random access memory (ReRAM).

13. The data storage system of claim 12, wherein the first access granularity is at byte level.

14. The data storage system of claim 11, wherein the first ECC encoder is configured to generate a codeword having a length equal to the first access granularity.

15. The data storage system of claim 11, wherein the second storage medium comprises a solid state drive (SSD).

16. The data storage system of claim 11, wherein the second storage device is configured to store the copy of the data chunk in the second storage medium using a log format.

17. The data storage system of claim 11, further comprising a table-updating mechanism configured to update a logical-address-to-physical address mapping table subsequent to the data chunk and its copy being stored in the first and second storage devices, respectively; wherein the mapping table comprised physical addresses of the data chunk in the first and second storage media.

18. The data storage system of claim 11, wherein the second ECC encoder is configured to perform an incremental encoding operation, which comprises:
 multiplying the data chunk with a sub-matrix of a parity-check matrix to generate a sub-syndrome associated with the data chunk, wherein a width of the sub-matrix equals to a length of the data chunk;
 accumulating sub-syndromes from previously received data chunks belonging to a same ECC codeword to generate a syndrome associated with the data chunk;
 in response to the data chunk being a last chunk within the same ECC codeword, generating parity data based on the parity-check matrix and the syndrome associated with the data chunk; and
 writing the parity data to the second storage medium.

19. The data storage system of claim 11, wherein the first storage device further comprises a first ECC decoder corresponding to the first ECC encoder, wherein the second storage device further comprises a second ECC decoder corresponding to the second ECC encoder;
 wherein the first ECC decoder is configured to:
  in response to a read request, retrieve a to-be-read data chunk from the first storage medium;
  perform a first decoding operation on the to-be-read data chunk; and
  determine whether the first decoding operation is successful;
 wherein, in response to the first ECC decoder determining that the first decoding operation is unsuccessful, the second ECC decoder is configured to:
  retrieve a codeword that includes the to-be-read data chunk from the second storage medium, wherein the codeword is generated by the second ECC encoder;
  perform a second decoding operation corresponding on the codeword;
  extract an error-free data chunk corresponding to the to-be-read data chunk from the decoded codeword; and
  return the extracted error-free data chunk.

20. The data storage system of claim 11, wherein the first storage device is configured to perform an in-place update in the first storage medium in response to receiving an update request; and
 wherein, in response to receiving the update request, the second storage device is configured to store an update data chunk to the second storage medium update a mapping between a logical address and a physical address of the update data chunk in the second storage medium.

* * * * *